(12) United States Patent
Tsuboi et al.

(10) Patent No.: US 12,219,712 B2
(45) Date of Patent: Feb. 4, 2025

(54) PRINTED CIRCUIT BOARD AND ELECTRONIC DEVICE

(71) Applicant: CANON KABUSHIKI KAISHA, Tokyo (JP)

(72) Inventors: Noritake Tsuboi, Yokohama (JP); Tomohisa Ishigami, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/455,234

(22) Filed: Aug. 24, 2023

(65) Prior Publication Data
US 2023/0403796 A1 Dec. 14, 2023

Related U.S. Application Data

(60) Continuation of application No. 17/810,917, filed on Jul. 6, 2022, now Pat. No. 11,792,936, which is a
(Continued)

(30) Foreign Application Priority Data

Mar. 26, 2019 (JP) .................................. 2019-059246
Feb. 27, 2020 (JP) .................................. 2020-032327

(51) Int. Cl.
*H05K 1/18* (2006.01)
*H04N 23/51* (2023.01)
(Continued)

(52) U.S. Cl.
CPC ............. *H05K 1/181* (2013.01); *H04N 23/51* (2023.01); *H05K 1/111* (2013.01); *H04N 23/54* (2023.01);
(Continued)

(58) Field of Classification Search
CPC ........ H04N 23/51; H04N 23/54; H04N 23/55; H04N 5/2252; H04N 5/2253;
(Continued)

(56) References Cited

U.S. PATENT DOCUMENTS 5,684,677 A 11/1997 Uchida
10,342,130 B2 7/2019 Nakagawa
(Continued)

FOREIGN PATENT DOCUMENTS

JP H07-74450 3/1995
JP 2015-144208 8/2015
JP 7098670 B2 7/2022

OTHER PUBLICATIONS

Japanese Office Action issued Feb. 6, 2024 during prosecution of related Japanese application No. 2022-101740 (English-Language machine translation included).

*Primary Examiner* — Michael P McFadden
(74) *Attorney, Agent, or Firm* — VENABLE LLP

(57) ABSTRACT

A printed circuit board includes a first chip component, a second chip component, and a printed wiring board. The first chip component and the second chip component each has a length L2 in the longitudinal direction. A relationship of $0.894 \leq L2/L1 \leq 1.120$ is satisfied, where L1 represents a length of the first opening in the longitudinal direction. A relationship of $0.894 \leq L2/L4 \leq 1.120$ is satisfied, where length L4 represents a length of the second opening in the longitudinal direction. A relationship of $0.183 \leq L_{OA}/L_{iA} \leq 0.309$ is satisfied, where $L_{iA}$ represents a length of the first land in the longitudinal direction, and $L_{OA}$ represents a thickness of solder on an end surface of the first electrode. A relationship of $0.183 \leq L_{OB}/L_{iB} \leq 0.309$ is satisfied, where $L_{iB}$ represents a length of the second land in the longitudinal direction, and $L_{OB}$ represents a thickness of solder on an end surface of the second electrode.

25 Claims, 9 Drawing Sheets

Related U.S. Application Data division of application No. 16/821,550, filed on Mar. 17, 2020, now Pat. No. 11,412,616.

(51) Int. Cl.
   *H04N 23/54* (2023.01)
   *H04N 23/55* (2023.01)
   *H05K 1/11* (2006.01)

(52) U.S. Cl.
   CPC ....... *H04N 23/55* (2023.01); *H05K 2201/099* (2013.01); *H05K 2201/10015* (2013.01); *H05K 2201/1003* (2013.01); *H05K 2201/10522* (2013.01); *H05K 2201/10636* (2013.01); *H05K 2201/10651* (2013.01)

(58) Field of Classification Search
   CPC ........ H04N 5/2254; H01G 4/232; H01G 4/40; H01G 4/30; H05K 1/181; H05K 1/111; H05K 2201/099; H05K 2201/10015; H05K 2201/1003; H05K 2201/10522; H05K 2201/10636; H05K 2201/10651

See application file for complete search history.

(56) References Cited

U.S. PATENT DOCUMENTS

| | | | | |
|---|---|---|---|---|
| 11,792,936 | B2 * | 10/2023 | Tsuboi | H04N 23/51 |
| | | | | 348/374 |
| 2001/0019176 | A1 * | 9/2001 | Ahiko | H01G 4/232 |
| | | | | 257/772 |
| 2003/0184986 | A1 | 10/2003 | Soga | |
| 2004/0214375 | A1 | 10/2004 | Naitoh | |
| 2007/0258225 | A1 | 11/2007 | Inagaki | |
| 2013/0094689 | A1 * | 4/2013 | Tanaka | H04R 19/005 |
| | | | | 381/355 |
| 2015/0223334 | A1 * | 8/2015 | Nakagawa | H01G 4/12 |
| | | | | 174/258 |
| 2015/0270068 | A1 | 9/2015 | Hattori | |
| 2015/0334844 | A1 * | 11/2015 | Shimabe | H05K 1/115 |
| | | | | 361/761 |
| 2015/0364253 | A1 * | 12/2015 | Arnold | H05K 1/111 |
| | | | | 228/180.22 |
| 2016/0007446 | A1 | 1/2016 | Ishikawa | |
| 2017/0033038 | A1 * | 2/2017 | Nakagawa | H01L 25/00 |
| 2017/0164472 | A1 * | 6/2017 | Matsuura | H05K 3/0023 |
| 2018/0254252 | A1 * | 9/2018 | Nakagawa | H01L 23/50 |
| 2019/0051605 | A1 | 2/2019 | Horibe | |
| 2020/0006303 | A1 * | 1/2020 | Akiba | H01L 23/49822 |

* cited by examiner

PRINTED CIRCUIT BOARD AND ELECTRONIC DEVICE

This application is a continuation of U.S. application Ser. No. 17/810,917, filed Jul. 6, 2022, which is a divisional of U.S. application Ser. No. 16/821,550, filed Mar. 17, 2020 (now U.S. Pat. No. 11,412,616, issued on Aug. 9, 2022), the contents of each of which are incorporated by reference herein.

BACKGROUND OF THE INVENTION

Field of the Invention

The present invention relates to a mounting technology of electronic components.

Description of the Related Art

As electronic devices such as digital still cameras and digital video cameras are required to be downsized, printed wiring boards used in the electronic devices are also required to be downsized. A printed wiring board has a plurality of electronic components mounted thereon. Thus, small-sized electronic components are used for downsizing the printed wiring board. The electronic components are chip components, such as capacitors, inductors, and resistors, with two terminals. Each of the electronic components has two electrodes disposed at two end portions in the longitudinal direction. Each electrode is bonded to a land of the printed wiring board via solder.

For downsizing the printed wiring board, it is also necessary that a distance between two electronic components (of the plurality of electronic components) adjacent to each other in the longitudinal direction is reduced. In this case, short-circuit between the two adjacent electronic components via solder must be avoided when the plurality of electronic components is mounted on the printed wiring board at high density.

Japanese Patent Application Publication No. H7-74450 describes a technique in which chip components are mounted on a board at high density. In addition, Japanese Patent Application Publication No. H7-74450 describes a technique in which a spacer is disposed between the chip component and the board for preventing sinking of the chip component. With this technique, the amount of projection of the solder on the side surface of the chip component can be reduced.

By the way, electronic components are downsized compared to conventional ones, and expected to be further downsized in the future. Thus, as the electronic components are further downsized, the spacer is also required to be downsized in the case where the spacer is disposed between the electronic component and the board as described in Japanese Patent Application Publication No. H7-74450. However, it is becoming difficult that the spacer is downsized in accordance with the downsizing of the electronic component. In addition, even if the spacer could be downsized, it would be difficult that the downsized spacer is positioned between the electronic component and the board with high accuracy.

SUMMARY OF THE INVENTION

According to a first aspect of the present invention, a printed circuit board includes a first chip component, a second chip component, and a printed wiring board. The first chip component and the second chip component each has a length L2 in the longitudinal direction and a length L3 in a lateral direction. The first chip component includes a first electrode and a second electrode disposed at end portions in a longitudinal direction. The second chip component includes a third electrode and a fourth electrode disposed at end portions in a longitudinal direction. The printed wiring board includes an insulating substrate, a solder resist film disposed on the insulating substrate and comprising a first opening and a second opening, a first land disposed in the first opening and bonded to the first electrode via solder, a second land disposed in the first opening and bonded to the second electrode via solder, a third land disposed in the second opening and bonded to the third electrode via solder, and a fourth land disposed in the second opening and bonded to the fourth electrode via solder. The first chip component is an inductor or a capacitor, and the second chip component is an inductor or a capacitor. The first chip component and the second chip component are disposed adjacent to each other along the longitudinal direction such that the longitudinal direction of the first chip component is aligned with the longitudinal direction of the second chip component. A distance Rx between the first chip component and the second chip component in the longitudinal direction is equal to or smaller than the length W. A relationship of $0.894 \leq L2/L1 \leq 1.120$ is satisfied, where L1 represents a length of the first opening in the longitudinal direction. A relationship of $0.894 \leq L2/L4 \leq 1.120$ is satisfied, where length L4 represents a length of the second opening in the longitudinal direction. A relationship of $0.183 \leq L_{OA}/L_{iA} \leq 0.309$ is satisfied, where $L_{iA}$ represents a length of the first land in the longitudinal direction, and $L_{OA}$ represents a thickness of solder on an end surface of the first electrode. A relationship of $0.183 \leq L_{OB}/L_{iB} \leq 0.309$ is satisfied, where $L_{iB}$ represents a length of the second land in the longitudinal direction, and $L_{OB}$ represents a thickness of solder on an end surface of the second electrode. A relationship of $0.183 \leq L_{OC}/L_{iC} \leq 0.309$ is satisfied, where $L_{iC}$ represents a length of the third land in the longitudinal direction, and $L_{OC}$ represents a thickness of solder on an end surface of the third electrode. A relationship of $0.183 \leq L_{OD}/L_{iD} \leq 0.309$ is satisfied, where $L_{iD}$ represents a length of the fourth land in the longitudinal direction, and $L_{OD}$ represents a thickness of solder on an end surface of the fourth electrode.

According to a second aspect of the present invention, a printed circuit board includes a first chip component, a second chip component, and a printed wiring board. The first chip component and the second chip component each has a length L2 in the longitudinal direction and a length L3 in a lateral direction. The first chip component includes a first electrode and a second electrode disposed at end portions in a longitudinal direction. The second chip component includes a third electrode and a fourth electrode disposed at end portions in a longitudinal direction. The printed wiring board includes an insulating substrate, a solder resist film disposed on the insulating substrate and comprising a first opening and a second opening, a first land disposed in the first opening and bonded to the first electrode via solder, a second land disposed in the first opening and bonded to the second electrode via solder, a third land disposed in the second opening and bonded to the third electrode via solder, and a fourth land disposed in the second opening and bonded to the fourth electrode via solder. Each of the first chip component and the second chip component is a resistor, and the first chip component and the second chip component are disposed adjacent to each other along the longitudinal direction such that the longitudinal direction of the first chip component is aligned with the longitudinal direction of the second chip component. A distance between the first chip component and the second chip component in the longitudinal direction is equal to or smaller than the length L3. A relationship of $0.894 \leq L2/L1 \leq 1.120$ is satisfied, where L1 represents a length of the first opening in the longitudinal direction. A relationship of $0.894 \leq L2/L4 \leq 1.120$ is satisfied, where length L4 represents a length of the second opening in the longitudinal direction. A relationship of $0.177 \leq L_{OA}/L_{iA} \leq 0.309$ is satisfied, where $L_{iA}$ represents a length of the first land in the longitudinal direction, and $L_{OA}$ represents a thickness of solder on an end surface of the first electrode. A relationship of $0.177 \leq L_{OB}/L_{iB} \leq 0.309$ is satisfied, where $L_{iB}$ represents a length of the second land in the longitudinal direction, and $L_{OB}$ represents a thickness of solder on an end surface of the second electrode. A relationship of $0.177 \leq L_{OC}/L_{iC} \leq 0.309$ is satisfied, where $L_{iC}$ represents a length of the third land in the longitudinal direction, and $L_{OC}$ represents a thickness of solder on an end surface of the third electrode. A relationship of $0.177 \leq L_{OD}/L_{iD} \leq 0.309$ is satisfied, where $L_{iD}$ represents a length of the fourth land in the longitudinal direction, and $L_{OD}$ represents a thickness of solder on an end surface of the fourth electrode.

Further features of the present invention will become apparent from the following description of exemplary embodiments with reference to the attached drawings.

DESCRIPTION OF THE EMBODIMENTS

First Embodiment

Figure 1:
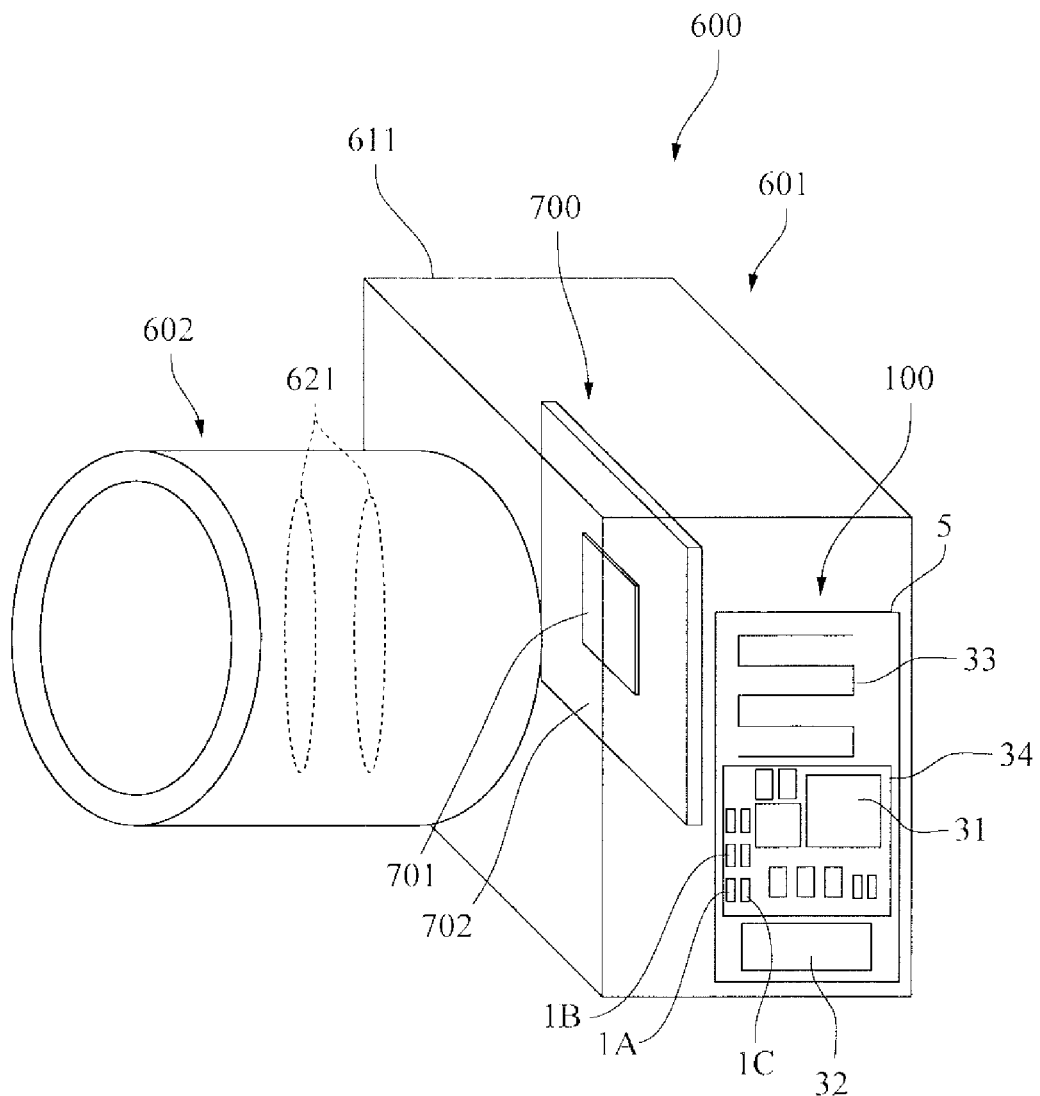
FIG. 1 is a diagram illustrating an electronic device of a first embodiment.

Hereinafter, some embodiments of the present invention will be described with reference to the accompanying drawings. FIG. 1 is a diagram illustrating a digital camera 600 that is an image pickup device as one example of electronic devices of a first embodiment. The digital camera 600 is a digital camera with interchangeable lenses, and includes a camera body 601. A lens barrel 602 that includes lenses 621 is detachably attached to the camera body 601. The camera body 601 includes a housing 611, a sensor module 700, an image processing module (not illustrated), and a wireless communication module 100 that is a printed circuit board. The wireless communication module 100 is one example of electronic modules. The wireless communication module 100, the sensor module 700, and the image processing module (not illustrated) are disposed in the housing 611.

The sensor module 700 includes an image sensor 701, and a printed wiring board 702 on which the image sensor 701 is mounted. The image sensor 701 may be a complementary metal oxide semiconductor (CMOS) image sensor or a charge coupled device (CCD) image sensor. The image sensor 701 has a function that converts the light incident through the lens barrel 602, to an electrical signal. The image processing unit includes an image processing device. The image processing device may be a digital signal processor. The image processing device has a function that receives the electrical signal from the image sensor 701, corrects the electrical signal, and creates image data from the corrected electrical signal.

The wireless communication module 100 performs wireless communication in a GHz band, for example. The wireless communication module 100 preferably has a transmission function. In the present embodiment, the wireless communication module 100 has a transmission function and a reception function. The wireless communication module 100 includes a printed wiring board 5 that includes an antenna 33, and a wireless communication IC 31 that is mounted on the printed wiring board 5 and that is one example of semiconductor components. In addition, the wireless communication module 100 includes a connector 32 that is mounted on the printed wiring board 5 and electrically connected to the wireless communication IC 31 via wires of the printed wiring board 5. The wireless communication IC 31 communicates wirelessly with an external device, such as a PC, a smartphone, or a wireless router, via the antenna 33; and thereby sends or receives image data. Specifically, the wireless communication IC 31 modulates a digital signal that represents image data, and transmits the modulated signal from the antenna 33, as a radio wave having a communication frequency that conforms to radio standards. In addition, the wireless communication IC 31 demodulates a radio wave received by the antenna 33, to a digital signal that represents image data. A shield case 34 is disposed between the housing 611 and the wireless communication module 100 so as to face semiconductor components and electronic components mounted on the printed wiring board 5.

The wireless communication module 100 also includes electronic components 1A, 1B, and 1C, which are mounted on the printed wiring board 5. Each of the electronic components is a chip component with two terminals. Preferably, each of the electronic components has a size equal to or smaller than the 0603 size. For example, the size of each component may be the 0603 size that is 0.6×0.3 mm in a plan view, the 0402 size that is 0.4×mm in a plan view, or the 0201 size that is 0.25×0.125 mm in a plan view. More preferably, the size of each component is equal to or smaller than the 0402 size for downsizing the electronic components. Note that the notation of the 0603 size, the 0402 size, the 0201 size, and the like conforms to the size notation (in millimeters) of electronic components defined in Japanese Industrial Standards.

Figure 2A:
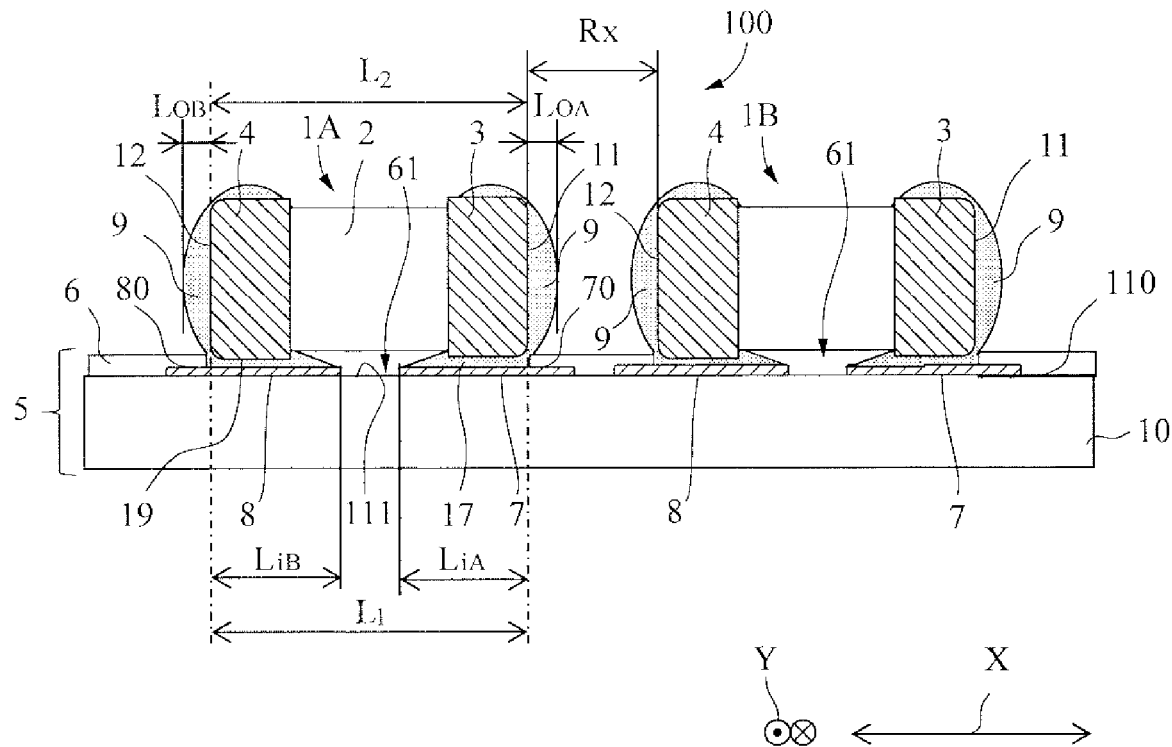
FIG. 2A is a schematic diagram of a bonding structure between electronic components and a printed wiring board of the first embodiment.
Figure 2B:
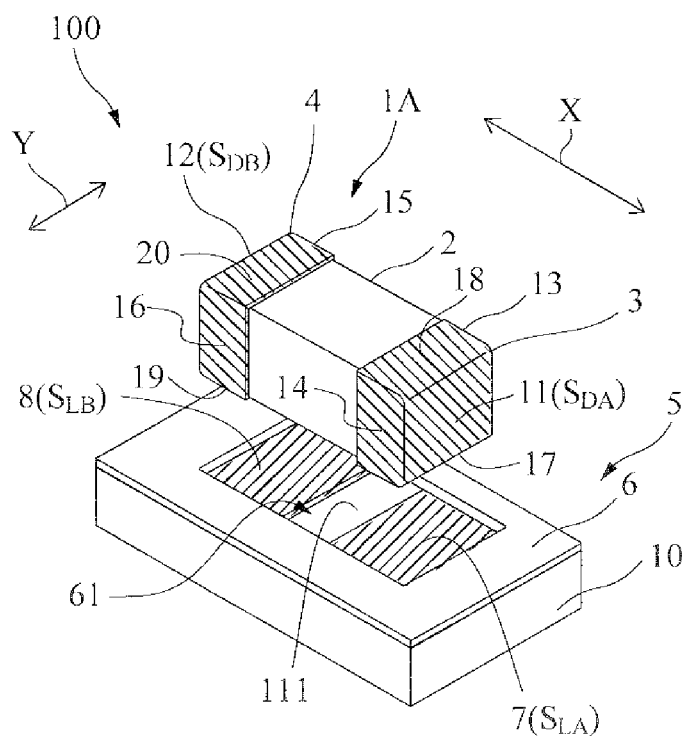
FIG. 2B is a perspective view of an electronic component and one portion of the printed wiring board of the first embodiment.

FIG. 2A is a schematic diagram of a bonding structure between the electronic components, 1A and 1B, and the printed wiring board 5 of the first embodiment. FIG. 2B is a perspective view of the electronic component 1A and one portion of the printed wiring board 5 of the first embodiment. For convenience of description, FIG. 2B illustrates a state before the electronic component 1A is mounted on the printed wiring board 5. Although FIG. 2B illustrates only the electronic component 1A, the electronic components 1B and 1C are similarly disposed on the printed wiring board 5.

As illustrated in FIGS. 2A and 2B, each of the electronic components 1A and 1B includes a main body 2, an electrode 3, and an electrode 4. The electrode 3 is a first electrode disposed at a first end portion of the main body 2, and the electrode 4 is a second electrode disposed at a second end portion of the main body 2. The first end portion is one of the two end portions of the main body 2 in a longitudinal direction X of the main body 2, and the second end portion is the other. The electronic components 1A and 1B are disposed adjacent to each other along the longitudinal direction such that the longitudinal direction of the electronic component 1A is equal to the longitudinal direction of the electronic component 1B.

The printed wiring board 5 includes an insulating substrate 10, a conductor pattern 70 that is a first conductor pattern, and a conductor pattern 80 that is a second conductor pattern. The conductor pattern 70 and the conductor pattern 80 are disposed on a main surface 110 of the insulating substrate 10. The conductor patterns 70 and 80 may be pieces of metal foil made of gold, silver, or copper. The conductor pattern 70 and the conductor pattern 80 are disposed on the main surface 110, spaced from each other in the longitudinal direction X. For example, the conductor patterns 70 and 80 are formed by using a manufacturing method, such as a subtractive process, in which a sheet of copper foil is laminated on the main surface 110 of the insulating substrate 10, and then unnecessary portions of the sheet is dissolved and removed with a chemical agent for leaving necessary conductor patterns. In addition, the printed wiring board 5 includes a solder resist film 6 formed on the main surface 110 and made of solder resist.

Figure 3A:
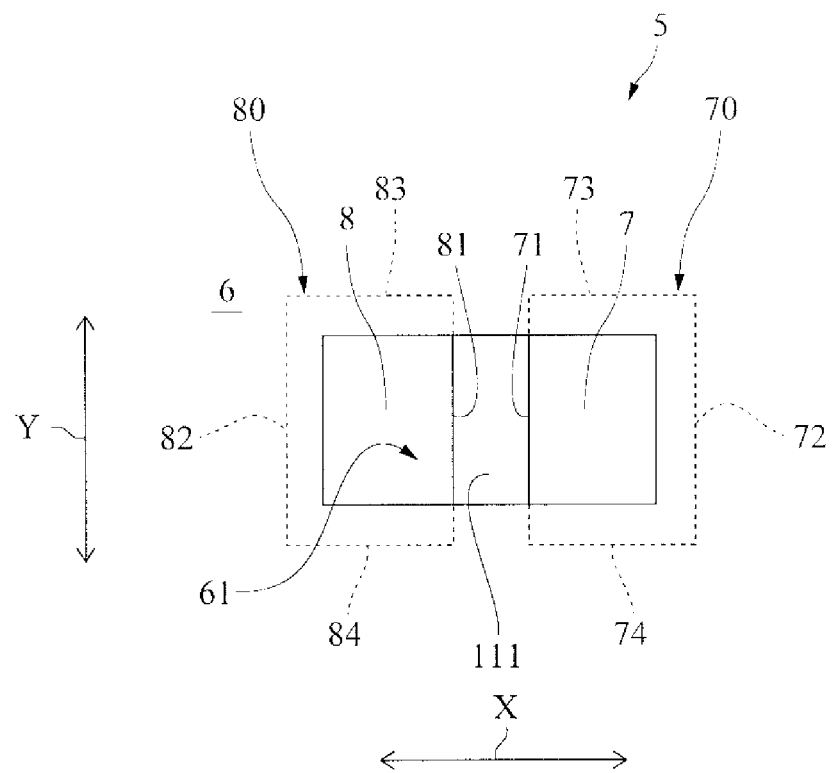
FIG. 3A is a plan view of one portion of the printed wiring board of the first embodiment.

FIG. 3A is a plan view of one portion of the printed wiring board 5 of the first embodiment. As illustrated in FIG. 3A, the solder resist film 6 has an opening 61 formed so as to expose one portion of the conductor pattern 70 and one portion of the conductor pattern 80 to the outside. The one portion of the conductor pattern 70 exposed by the opening 61 is a land 7 that is a first land. The one portion of the conductor pattern 80 exposed by the opening 61 is a land 8 that is a second land. The land 7 and the land 8 are disposed, spaced from each other in the longitudinal direction X. Thus, a portion 111 of the main surface 110 of the insulating substrate 10 formed between the land 7 and the land 8 is exposed to the outside by the opening 61.

An edge portion 71 of the conductor pattern 70 that faces the conductor pattern 80 in the longitudinal direction X is exposed to the outside without covered by the solder resist film 6, and an edge portion 72 of the conductor pattern 70 opposite to the edge portion 71 is covered by the solder resist film 6. With this arrangement, the conductor pattern 70 can be prevented from peeling off from the main surface 110. In addition, an edge portion 81 of the conductor pattern that faces the conductor pattern 70 in the longitudinal direction X is exposed to the outside without covered by the solder resist film 6, and an edge portion 82 of the conductor pattern 80 opposite to the edge portion 81 is covered by the solder resist film 6. With this arrangement, the conductor pattern 80 can be prevented from peeling off from the main surface 110.

In the first embodiment, two edge portions 73 and 74 of the conductor pattern 70 in a lateral direction Y orthogonal to the longitudinal direction X are covered by the solder resist film 6. With this arrangement, the conductor pattern 70 can be more effectively prevented from peeling off from the main surface 110. Similarly, two edge portions 83 and 84 of the conductor pattern 80 in the lateral direction Y are covered by the solder resist film 6. With this arrangement, the conductor pattern 80 can be more effectively prevented from peeling off from the main surface 110. As illustrated in FIG. 2A, the electrode 3 and the land 7 are bonded to each other via a bonding portion 9 that contains solder. Similarly, the electrode 4 and the land 8 are bonded to each other via the bonding portion 9 that contains solder.

The thickness of the solder resist film 6 is not limited to a specific value. For example, the thickness of the solder resist film 6 is equal to or larger than 10 μm and equal to or smaller than 35 μm. In addition, it is preferable that the top surface of the solder resist film 6 is higher in position than the top surface of the lands 7 and 8 by 5 μm or more. This is because when the solder resist exists at a position higher than the top surface of the lands 7 and 8, the sinking of the electronic component can be suppressed by a so-called lift-up effect, and the solder can be sufficiently accommodated in a space between each land and the electronic component. If the solder is sufficiently accommodated in a concave portion of the opening 61 of the solder resist film 6, the length of projection of the solder that projects from an end surface of each electrode can be reduced.

In the first embodiment, the electronic components 1A, 1B, and 1C are chip components, each of which is an inductor or a capacitor. As illustrated in FIG. 2B, the electrode 3 includes an end surface 11, and side surfaces 13 and 14. The end surface 11 is located at an outermost position in the longitudinal direction X and orthogonal to the longitudinal direction X, and the side surfaces 13 and 14 are located at an outermost position in the lateral direction Y and orthogonal to the lateral direction Y. That is, the normal line to the end surface 11 extends in the longitudinal direction X, and the normal line to the side surfaces 13 and 14 extends in the lateral direction Y. In addition, the electrode 3 includes a bottom surface 17 and a top surface 18. Each of the surfaces 11, 13, 14, 17, and 18 may be a flat surface or a curved surface. The electrode 4 includes an end surface 12, and side surfaces 15 and 16. The end surface 12 is located at an outermost position in the longitudinal direction X and orthogonal to the longitudinal direction X, and the side surfaces 15 and 16 are located at outermost positions in the lateral direction Y and orthogonal to the lateral direction Y. That is, the normal line to the end surface 12 extends in the longitudinal direction X, and the normal line to the side surfaces 15 and 16 extends in the lateral direction Y In addition, the electrode 4 includes a bottom surface 19 and a top surface 20. Each of the surfaces 12, 15, 16, 19, and 20 may be a flat surface or a curved surface. Thus, if the electronic component is a chip component that is an inductor or a capacitor, each of the electrodes 3 and 4 has five surfaces to which the solder adheres.

As illustrated in FIG. 1, when a plurality of electronic components is mounted, closer to one another, on the printed wiring board 5 at high density, the distance between two adjacent electronic components is required to be reduced. By the way, for mounting each electronic component 1(1A, 1B, or 1C) on the printed wiring board 5, the surface mount technology (SMT) is used, which includes a printing process, a mounting process, and a reflow process.

In the printing process, the screen printing that uses a mask is used. The mask is a thin metal plate made of stainless steel or the like and having holes. Via the mask, solder paste (not illustrated) that contains solder particles and flux is supplied to the lands 7 and 8 illustrated in FIG. 2B. In the mounting process, the electronic component 1A fed by a feeder or the like is sucked by a suction nozzle disposed at a head. After that, the electronic component 1A sucked by the suction nozzle is positioned at a position above the lands 7 and 8 on which the solder paste is disposed, and then the electronic component 1A is put on the solder paste by lowering the suction nozzle.

In the reflow process, the solder paste is melted by heat for soldering the electronic component 1 to the lands 7 and 8. During the reflow process, the melted solder creeps up on the end surface 11 of the electrode 3 and the end surface 12 of the electrode 4 of the electronic component 1. With this process, the bonding strength is secured.

However, if the melted solder excessively projects outward from the end surface of each electrode, a short-circuit failure will occur between two electronic components disposed closer to each other. As a countermeasure to this problem, a spacer might be able to be disposed under the electronic component for preventing the sinking of the electronic component and for controlling the amount of the solder that projects outward from the end surface of the electrode. However, since the electronic component is downsized, it is difficult to dispose a small spacer on the printed wiring board.

As another countermeasure to the problem, the amount of the solder paste could be reduced to the amount that does not cause the short-circuit failure. Specifically, the holes of the mask used in the screen printing might be able to be made smaller. However, if the holes of the mask are made smaller, the solder paste will be easily left in the holes of the mask, due to the viscosity of the solder paste. As a result, the solder paste may be insufficiently supplied to the lands. Thus, adjusting the amount of solder paste is limited to some extent. By the way, on the printed wiring board, not only small electronic components with sizes equal to or smaller than the 0402 size, but also large IC components and connectors are mounted, and the large components are also required to have sufficient bonding strength. In addition, in the screen printing, a single mask is used for supplying the solder paste to the printed wiring board at a time for bonding the electronic components, the IC components, and the connectors to the printed wiring board. Thus, it is difficult to use such a mask and perform the fine adjustment on the amount of solder paste for adapting the amount of solder paste to the small electronic components.

In the first embodiment, the length of the opening 61 of the solder resist film 6 in the longitudinal direction X is made nearly equal to the length of the electronic components 1A, 1B, and 1C in the longitudinal direction X. Specifically, the opening 61 is formed so as to satisfy the relationship of $0.894 \leq L_2/L_1 \leq 1.120$, where $L_1$ is a length of the opening 61 in the longitudinal direction X and $L_2$ is a length of the electronic component 1 in the longitudinal direction X. In addition, since the end surface 11 of the electrode 3 of the electronic components 1A, 1B, and 1C and an edge portion of the land 7 located outside in the longitudinal direction X are aligned with each other in a plan view, and the end surface 12 of the electrode 4 and an edge portion of the land 8 located outside in the longitudinal direction X are aligned with each other in the plan view, the solder bonding portion 9 forms a filletless structure as illustrated in FIG. 2A.

If the size of the electronic components 1A, 1B, and 1C is the 0402 size, the nominal value of the length $L_2$ of the electronic components 1A, 1B, and 1C in the longitudinal direction X is 0.4 mm. Thus, the reference value of the length $L_1$ of the opening 61 in the longitudinal direction X is 0.4 mm, which is the same as the nominal value of the electronic components 1A, 1B, and 1C. The tolerance of the reference value, 0.4 mm, of the length $L_1$ of the opening 61 in the longitudinal direction X, that is, the manufacturing error is about ±0.025 mm in the previously-described subtractive process. In addition, the tolerance of the length $L_2$ of the electronic components 1A, 1B, and 1C in the longitudinal direction X is about ±0.02 mm. Thus, the lower limit of $L_2/L_1$ is $(0.4-0.02)/(0.4+0.025)=0.894$. In addition, the upper limit of $L_2/L_1$ is $(0.4+0.02)/(0.4-0.025)=1.120$. If $L_2/L_1$ is 1.00 or less, the above-described lift-up effect is easily produced.

When the length $L_1$ of the opening 61 of the solder resist film 6 in the longitudinal direction X is made nearly equal to the length $L_2$ of the electronic components 1A, 1B, and 1C in the longitudinal direction X as described above, the solder resist film 6 is located closer to the electrodes 3 and 4. With this arrangement, when the melted solder wets and spreads on the lands 7 and 8 in the reflow process, the melted solder does not wet and spread on a portion that is located outside the electronic component in a plan view. That is, since the melted solder stays under the bottom surface of the electronic component, the melted solder causes its surface tension to lift the electronic component. Thus, the electronic components 1A, 1B, and 1C can be suppressed from sinking toward the lands 7 and 8, and the melted solder can be accommodated in a space between the electronic component 1A, 1B, or 1C and the lands 7 and 8. In addition, since the opening 61 of the solder resist film 6 is disposed so as to be along with the outer shape of the electronic component in a plan view of the printed wiring board 5, three sides of each of the lands 7 and 8 are surrounded with the solder resist film 6. Thus, while the electronic components 1A, 1B, and 1C can be suppressed from sinking toward the lands 7 and 8, the electronic components can be further lifted, and the melted solder can be accommodated more in the space between the electronic component 1A, 1B, or 1C and the lands 7 and 8. In this manner, even though the mask is used for supplying the solder paste to the printed wiring board 5 at a time, the solder can be suppressed from projecting outward in the longitudinal direction X, from the end surface 11 of the electrode 3 and from the end surface 12 of the electrode 4. Therefore, the electronic components 1A, 1B, and 1C can be mounted on the printed wiring board 5 at high density while the bonding strength of the solder bonding portion 9 is secured.

In the first embodiment, it is preferable that the composition of the solder paste used for forming the solder bonding portion 9 is Sn-3.0Ag-0.5Cu, that is, Ag is 3.0 percent by mass, Cu is 0.5 percent by mass, and Sn is the rest. In addition, the viscosity of the solder paste is preferably in a range from 170 to 210 Pas (25° C.). In addition, the average particle diameter of the solder paste is preferably about 20 µm. The content of flux of the solder paste is preferably in a range from 10.5 to 12.5 percent by mass.

In the first embodiment, as illustrated in FIG. 2A, the length $L_2$ of the electronic component 1 in the longitudinal direction X is equal to or smaller than the length $L_1$ of the opening 61 in the longitudinal direction X, and the relationship of $0.894 \leq L_2/L_1 \leq 1$ is satisfied. In addition, the width of the opening 61 in the lateral direction Y is equal to the width of the electronic components 1A, 1B, and 1C in the lateral direction Y.

Figure 3B:
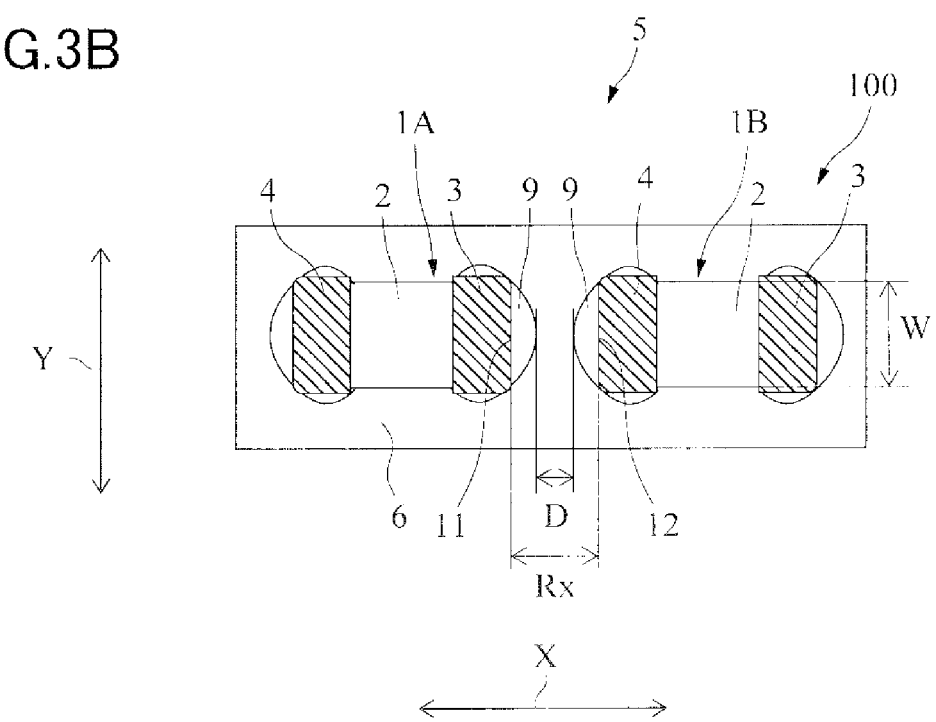
FIG. 3B is a plan view of one portion of a printed circuit board of the first embodiment.

FIG. 3B is a plan view of one portion of the wireless communication module 100, which is one example of printed circuit boards of the first embodiment. FIG. 3B illustrates two electronic components 1A and 1B (of a plurality of electronic components) adjacent to each other in the longitudinal direction X of the electronic components 1A and 1B. The two electronic components, 1A and 1B, illustrated in FIG. 3B have the same size, each allowing variations within the tolerance. In a plan view of the printed wiring board 5, a shortest distance Rx between the end surface 11 of an electrode of one of the two electronic components and the end surface 12 of an electrode of the other in the longitudinal direction X is equal to or smaller than a width W of the main body 2 of the electronic component in the lateral direction Y (the end surface 11 and the end surface 12 are disposed, facing each other). That is, the two electronic components 1A and 1B are mounted on the printed wiring board 5 at high density, disposed adjacent to each other along the longitudinal direction X of the electronic components 1A and 1B.

Since each of the electronic components 1A and 1B is a chip component that is an inductor or a capacitor, the area of each of the end surfaces 11 and 12 is larger than the area of side surfaces 13, 14, 15, and 16, the area of bottom surfaces 17 and 19, and the area of the top surfaces 18 and 20. Thus, when the solder paste is melted, the melted solder adheres to the end surfaces 11 and 12 of the electronic components 1A and 1B, more than the side surfaces 13, 14, 15, and 16. That is, it would be difficult to dispose electronic components at high density in the longitudinal direction X (such that the distance between the electronic components is reduced), unlike in the lateral direction Y of the main body 2 illustrated in FIG. 3B.

Thus, in the first embodiment, the length of projection of the solder that projects from each of the end surfaces 11 and 12 in the longitudinal direction X is controlled by adjusting the shape of each of the lands 7 and 8 with respect to the area of each of the end surfaces 11 and 12.

In FIG. 2A, the length of projection of the solder that projects outward in the longitudinal direction X from the end surface 11 of the electronic component 1A is denoted by $L_{OA}$, and the length of the land 7 that extends inward in the longitudinal direction X from the end surface 11 of the electronic component 1A, that is, the length of the land 7 in the longitudinal direction X that is exposed to the outside without covered with the solder resist, is denoted by $L_{iA}$. Similarly, the length of projection of the solder that projects outward in the longitudinal direction X from the end surface 12 of the electronic component 1A is denoted by $L_{OB}$, and the length of the land 8 that extends inward in the longitudinal direction X from the end surface 12 of the electronic component 1A, that is, the length of the land 8 in the longitudinal direction X that is exposed to the outside without covered with the solder resist, is denoted by $L_{iB}$. In this bonding structure, the length of projection of the solder can be effectively reduced when the following relationship is satisfied.

$$0.183 \leq L_{OA}/L_{iA} \leq 0.309$$

$$0.183 \leq L_{OB}/L_{iB} \leq 0.309$$

This relationship is derived from the following simulation result.

The electronic component 1A is an inductor or a capacitor with the 0402 size. That is, an area $S_{DA}$ of the end surface 11 of the electrode 3 and an area $S_{DB}$ of the end surface 12 of the electrode 4 are each 0.04 mm$^2$, which is smaller than 0.05 mm$^2$. The material of the insulating substrate 10 is the flame-retardant type 4 (FR-4). The size of the opening 61 of the solder resist film 6 is 0.4×0.2 mm, in a plan view of the printed wiring board 5, so that the outer shape of the electronic component is surrounded by the opening 61.

Under these conditions, the relationship between an area $S_{LA}$ of the land 7 and the length (maximum value) of projection of the solder that projects from the end surface 11 of the electrode 3 in the longitudinal direction X, and the relationship between an area $S_{LB}$ of the land 8 and the length (maximum value) of projection of the solder that projects from the end surface 12 of the electrode 4 in the longitudinal direction X were simulated by using a computer.

Figure 4:
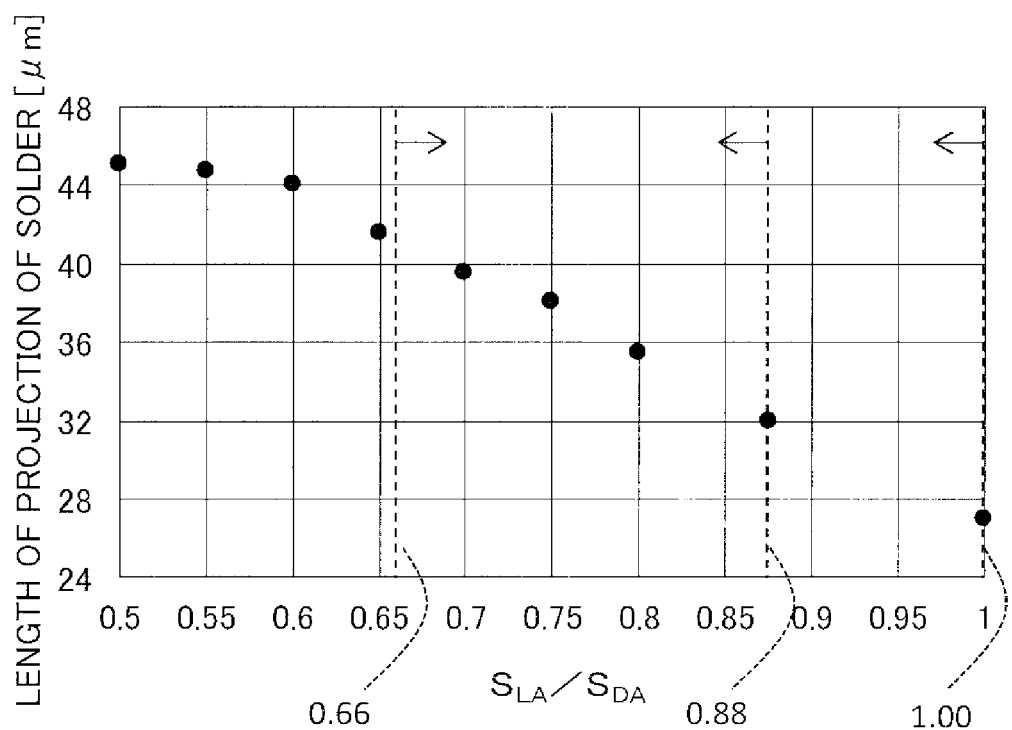
FIG. 4 is a graph illustrating a simulation result obtained in the first embodiment.

In the simulation, the width of each of the lands 7 and 8 in the lateral direction Y was set at a constant value of 0.2 mm, and the length of each of the lands 7 and 8 in the longitudinal direction X was changed in a range from 0.1 to 0.2 mm. The analysis was performed through thermal fluid simulation, with the length of each of the lands 7 and 8 in the longitudinal direction X being changed. In the simulation, when the change in shape of the solder stopped, the shape of the solder was determined as a bonding shape, and the lengths of projections of the solder that project from the end surfaces 11 and 12 were calculated. The volume of the melted solder on each of the lands 7 and 8 was set at a constant value of 1 million μm$^3$, and the distance between the top surface of the land 7 and the bottom surface 17 of the electrode 3, and between the top surface of the land 8 and the bottom surface 19 of the electrode 4 was set at a constant value of FIG. 4 is a graph illustrating a simulation result obtained in the first embodiment. FIG. 4 illustrates a calculation result on the length of projection of the solder with respect to $S_{LA}/S_{DA}$. Note that since the length of projection of the solder that projects from the end surface 12 is the same as that of the solder that projects from the end surface 11, the description will be made for the length of projection of the solder that projects from the end surface 11.

It can be seen from FIG. 4 that when $S_{LA}/S_{DA} \leq 0.6$, the length of projection of the solder that projects from the end surface 11 hardly changes. That is, the length of projection of the solder is not reduced. In contrast, it can be seen that when $S_{LA}/S_{DA}$ is equal to or larger than 0.66, the length of projection of the solder can be reduced by 10% or more, compared to the length obtained when $S_{LA}/S_{DA}=0.5$. Thus, it is preferable that $S_{LA}/S_{DA}$ is equal to or larger than 0.66. When $S_{LA}/S_{DA}$ is 0.66, the length $L_{iA}$ of the land 7 of the electronic component 1A is 132.5 μm. The thermal fluid simulation was performed with the length $L_{iA}$ of 132.5 μm, and the length of projection of the solder that projects outward in the longitudinal direction X from the end surface 11 was calculated. As a result, the length of projection of the solder is 41 μm. Thus, if the electronic component 1A is an inductor or a capacitor with the 0402 size, the upper limit of $L_{OA}/L_{iA}$ is 0.309 (=41/132.5).

The length of projection of the solder can be made smaller as the value of $S_{LA}/S_{DA}$ increases. However, if the width of the lands 7 and 8 in the lateral direction Y is 0.2 mm, and the lands 7 and 8 are extended in the longitudinal direction X, the lands 7 and 8 will contact each other when the length of each of the lands 7 and 8 in the longitudinal direction X is 0.2 mm. In this case, $S_{LA}/S_{DA}=1.00$, and $S_{LB}/S_{DB}=1.00$. Thus, the land 7 and the land 8 are separated from each other when $S_{LA}/S_{DA} \leq 1.00$ and $S_{LB}/S_{DB} \leq 1.00$.

In the subtractive process that is a common method of manufacturing printed boards, if a distance between lands is too small, the lands will contact each other and easily cause a short-circuit failure. The distance between the land 7 and the land 8 that hardly causes the short-circuit failure is 0.05 mm or more. Thus, if the width of the lands 7 and 8 in the lateral direction Y is set at 0.2 mm, and the distance between the land 7 and the land 8 is set at 0.05 mm, the length of each of the lands 7 and 8 in the longitudinal direction X is 0.175 mm. The thermal fluid simulation was performed with the length $L_{iA}$ of 175 μm, and the length of projection of the solder that projects outward in the longitudinal direction X from the end surface 11 was calculated. As a result, the length of projection of the solder is 32 μm. Thus, if the electronic component 1 is an inductor or a capacitor with the 0402 size, the lower limit of $L_{OA}/L_{iA}$ is 0.183 (=32/175). In this case, $S_{LA}/S_{DA}$ is 0.88.

As described above, in the first embodiment, it is preferable that $0.66 \leq S_{LA}/S_{DA}$ and $0.66 \leq S_{LB}/S_{DB}$. With these conditions, the length of projection of the solder that projects from the end surfaces 11 and 12 can be effectively reduced, and the short-circuit failure can be effectively prevented.

In addition, for preventing the short-circuit failure, the length of projection of the solder that projects from the end surfaces 11 and 12 is reduced. However, a certain amount of solder is necessary for the end surfaces 11 and 12 for keeping the bonding strength. Thus, it is preferable that $S_{LA}/S_{DA} \leq 0.88$ and $S_{LB}/S_{DB} \leq 0.88$.

In addition, it is preferable that the ratio of the area of the portion 111 to the area of the opening 61 of the solder resist film 6, illustrated in FIG. 3A, is equal to or larger than 12.5% and equal to or smaller than 34%. If the ratio is in the range, the length of projection of the solder can be effectively reduced. The ratio is a percentage obtained by dividing the area of the portion 111 by the area of the opening 61 (the portion 111 is one portion of the insulating substrate 10, and is positioned between the lands 7 and 8 and exposed). The value 12.5% is a calculation result of (0.4×0.2−0.175×0.2×2)/(0.4×0.2). The value 34% is a calculation result of (0.4×0.2−0.1325×0.2×2)/(0.4×0.2).

In the graph of FIG. 4, the length of projection of the solder has an inflection point with respect to $S_{LA}/S_{DA}$. This is probably because the shape of the projection of the solder approximates a circular convex. In the first embodiment, since the solder bonding portion 9 has the filletless structure, the solder having adhered to the electrode 3 forms a circular shape. Thus, the length of projection of the solder can be regarded as one portion of the radius of the circle. If the area of the land 7 is increased, that is, if part of the circular shape of solder is moved toward the bottom surface of the electrode 3 and the amount of the part of the solder is equal to or larger than a predetermined amount, the radius of the circle of the solder increases. As the radius of the circle of the solder increases, the solder moves inward in the longitudinal direction X, in the portion outside the end surface 11 of the electronic component 1. As a result, the length of projection of the solder that projects from the end surface 11 can be reduced.

Thus, if each of the electronic components 1A and 1B is a chip component that is a capacitor or an inductor with the 0402 size, and a distance Rx, illustrated in FIG. 3B, between two electronic components 1A and 1B adjacent to each other in the longitudinal direction X is 0.15 mm, the shortest distance D is calculated as 68 μm (=150−41×2), from the above-described result.

In addition to the simulation, the two electronic components 1A and 1B were actually mounted on the printed wiring board 5, and the shortest distance D was measured.

The distance Rx between the two electronic components 1A and 1B adjacent to each other in the longitudinal direction X was set at 0.15 mm. Each size of the lands 7 and 8 was set at 0.1325×0.2 mm, and $S_{LA}/S_{DA}$ was set at 0.66. Under these conditions, the shortest distance D was measured.

Specifically, the solder was supplied as solder paste in the printing process, and melted by heating. Then a sample with a volume of melted solder of about 1 million μm³ was extracted, and the shortest distance D in the sample was measured. As a result, the shortest distance D was 59 μm.

Thus, there is a difference between the simulation result and the actual measurement result. This can be caused by the tolerance of the outer shape of the electronic components 1A and 1B, a difference in position of the mounted electronic components 1A and 1B, and a difference in position of the electronic components 1A and 1B caused by the self-alignment when the solder is melted.

For these reasons, it is understood that the actual shortest distance D was obtained, smaller than the calculated shortest distance D. However, even though the actual shortest distance D varied, there was no failure in bonding in the solder bonding portion 9. In addition, even when the electronic components 1A and 1B were closely disposed in the longitudinal direction X, spaced from each other by 0.15 mm, the short-circuit failure did not occur.

As can be seen from the above-described simulation and the experimental result, the short-circuit failure and the failure in bonding can be prevented even when the distance Rx between the electronic components 1A and 1B in the longitudinal direction X is 0.15 mm. In addition, it was confirmed that the electronic components can be mounted at high density even when the distance Rx in the longitudinal direction X is 0.15 mm or less. Therefore, in the present embodiment, small electronic components 1A and 1B can be mounted at high density without disposing any additional members, such as spacers, between the electronic components 1A and 1B and the printed wiring board 5.

Note that although the description has been made for the electronic components 1A and 1B with the 0402 size, the present disclosure is not limited to this. For example, the electronic components 1A and 1B may have another size, such as the 0201 size, smaller than the 0402 size. That is, the electronic components 1A and 1B that face each other can be mounted at high density such that the distance Rx between the electronic components 1A and 1B in the longitudinal direction X of the main body 2 of each of the electronic components 1A and 1B is equal to or smaller than the width W of the main body 2 in the lateral direction Y.

Figure 9:
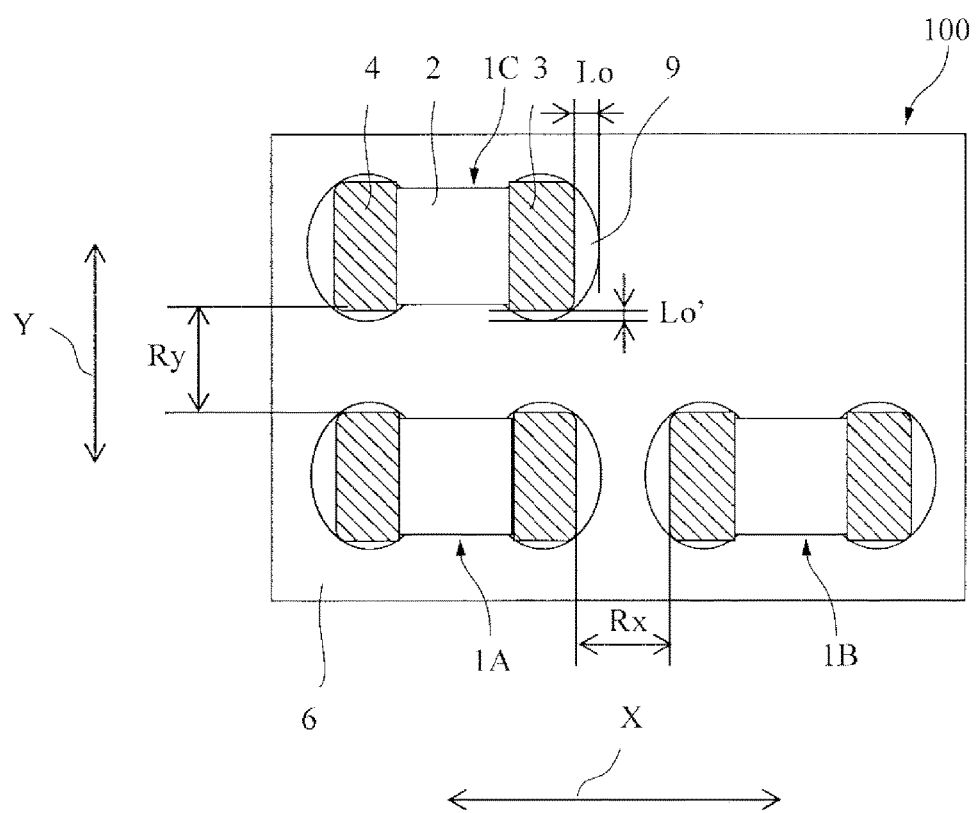
FIG. 9 is a plan view of one portion of a printed circuit board which is of the first embodiment and which includes three electronic components.

In addition, as illustrated in FIG. 9, since a length $L_O$ of projection of the solder that projects in the longitudinal direction X can be reduced, the length $L_O$ of projection of the solder can be controlled so as to have a value equal to or smaller than a length $L_O'$ of projection of the solder in the lateral direction Y.

Actually, even when the electronic components 1A, 1B, and 1C were closely mounted, spaced from each other by 0.15 mm in the longitudinal direction X and by 0.15 mm in the lateral direction Y, the short-circuit failure did not occur.

Thus, the electronic components 1A, 1B, and 1C can be mounted at high density by disposing the electronic components 1A, 1B, and 1C so as to satisfy the relationship of Ry≥Rx, where Rx is a distance between the electronic components 1A and 1B disposed close to each other in the longitudinal direction X, and Ry is a distance between the electronic components 1A and 1C disposed close to each other in the lateral direction Y.

Second Embodiment

Figure 5:
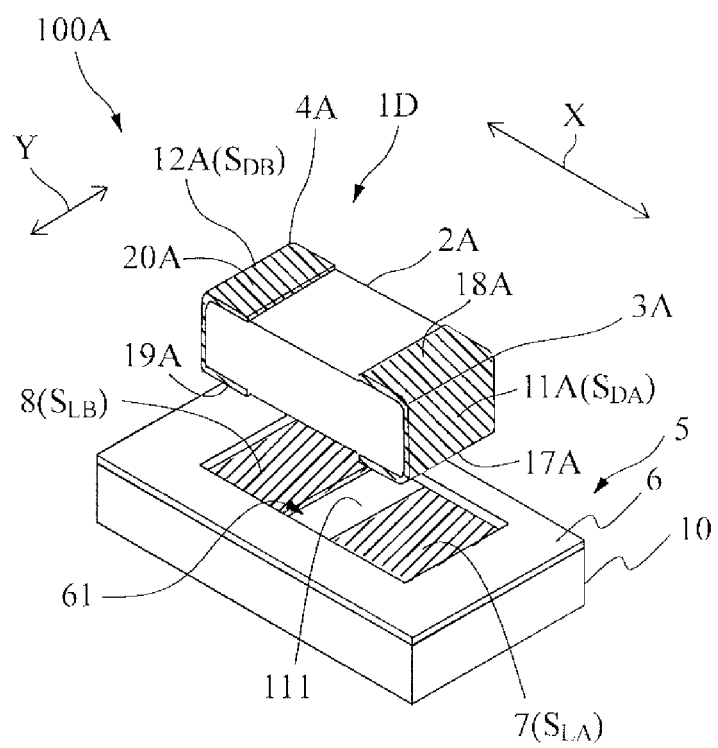
FIG. 5 is a perspective view of an electronic component and one portion of a printed wiring board of a second embodiment.

Next, a printed circuit board of a second embodiment will be described. FIG. 5 is a perspective view of an electronic component 1D and one portion of the printed wiring board 5 of the second embodiment. For convenience of description, FIG. 5 illustrates a state before the electronic component 1D is mounted on the printed wiring board 5. Although FIG. 5 illustrates only the single electronic component 1D for convenience of description, the electronic component 1D and at least one other electronic component similar to the electronic component 1D are disposed adjacent to each other in the longitudinal direction X of the electronic component 1D. In the second embodiment, a component identical to a component of the first embodiment is given an identical symbol, and the detailed description thereof will be omitted.

In the first embodiment, the description has been made for the case where the electronic component is a chip component that is an inductor or a capacitor. In the second embodiment, the description will be made for a case where the electronic component 1D is a chip component that is a resistor. The resistor is the same as the capacitor and the inductor in size in a plan view, but is different from the capacitor and the inductor in length in the thickness direction and in electrode structure.

The electronic component 1D includes a main body 2A, an electrode 3A, and an electrode 4A. The electrode 3A is a first electrode disposed at a first end portion of the main body 2A, and the electrode 4A is a second electrode disposed at a second end portion of the main body 2A. The first end portion is one of the two end portions of the main body 2A in a longitudinal direction X (that is a predetermined direction) of the main body 2A, and the second end portion is the other.

As described in the first embodiment, the printed wiring board 5 includes the solder resist film 6 formed on the main surface 110 of the insulating substrate 10. The solder resist film 6 has the opening 61 that exposes the lands 7 and 8. In the second embodiment, as in the first embodiment, the length of the opening 61 of the solder resist film 6 in the longitudinal direction X is made nearly equal to the length of the electronic components 1D in the longitudinal direction X. In addition, as in the first embodiment, the width of the opening 61 in the lateral direction Y is equal to the width of the electronic components 1D in the lateral direction Y.

In the second embodiment, the electronic component 1D is a chip component that is a resistor. The electrode 3A has an end surface 11A, a bottom surface 17A, and a top surface 18A. Each of the surfaces 11A, 17A, and 18A may be a flat surface or a curved surface. The electrode 3A has no side surfaces described in the first embodiment, and located at outermost positions in the lateral direction Y and orthogonal to the lateral direction Y. The end surface 11A is located at an outermost position in the longitudinal direction X and orthogonal to the longitudinal direction X. That is, the normal line to the end surface 11A extends in the longitudinal direction X. The electrode 4A has an end surface 12A, a bottom surface 19A, and a top surface 20A. Each of the surfaces 12A, 19A, and 20A may be a flat surface or a curved surface. The electrode 4A has no side surfaces described in the first embodiment, and located at outermost positions in the lateral direction Y and orthogonal to the lateral direction Y. The end surface 12A is located at an outermost position in the longitudinal direction X and orthogonal to the longitudinal direction X. That is, the normal line to the end surface 12A extends in the longitudinal direction X. Thus, if the electronic component 1D is a chip component that is a resistor, each of the electrodes 3A and 4A has three surfaces to which the solder adheres. Thus, more solder adheres to the end surfaces 11A and 12A.

Thus, in the second embodiment, the length of projection of the solder that projects from the end surfaces 11A and 12A in the longitudinal direction X is controlled by adjusting the shape of the land 7 with respect to the area of the end surface 11A, and by adjusting the shape of the land 8 with respect to the area of the end surface 12A.

The length of projection of the solder that projects outward in the longitudinal direction X from the end surface 11A of the electronic component 1D is denoted by $L_{OA}$, and the length of the land 7 that extends inward in the longitudinal direction X from the end surface 11A of the electrode 3A of the electronic component 1D is denoted by $L_{iA}$. Similarly, the length of projection of the solder that projects outward in the longitudinal direction X from the end surface 12A of the electronic component 1D is denoted by $L_{OB}$, and the length of the land 8 that extends inward in the longitudinal direction X from the end surface of the electrode 4A of the electronic component 1D is denoted by $L_{iB}$. In this bonding structure, the length of projection of the solder can be effectively reduced by satisfying the following relationship.

$$0.177 \le L_{OA}/L_{iA} \le 0.309$$

$$0.177 \le L_{OB}/L_{iB} \le 0.309$$

This relationship is derived from the following simulation result.

The electronic component 1D is a resistor with the 0402 size. An area $S_{DA}$ of the end surface 11A of the electrode 3A and an area $S_{DB}$ of the end surface 12A of the electrode 4A are each 0.026 mm². That is, the area $S_{DA}$ of the end surface 11A and the area $S_{DB}$ of the end surface 12A are smaller than 0.05 mm². The material of the insulating substrate 10 is FR-4. The size of the opening 61 of the solder resist film 6 is 0.4×0.2 mm, in a plan view of the printed wiring board 5, so that the outer shape of the electronic component is surrounded by the opening 61.

Under these conditions, the relationship between the area $S_{LA}$ of the land 7 and the length (maximum value) of projection of the solder that projects from the end surface 11A of the electrode 3A in the longitudinal direction X, and the relationship between the area $S_{LB}$ of the land 8 and the length (maximum value) of projection of the solder that projects from the end surface 12A of the electrode 4A in the longitudinal direction X were simulated by using a computer.

In the simulation, the width of the lands 7 and 8 in the lateral direction Y was set at a constant value of 0.2 mm, and the length of the lands 7 and 8 in the longitudinal direction X was changed in a range from 0.1 to 0.2 mm. The analysis was performed through the thermal fluid simulation, with the length of the lands 7 and 8 in the longitudinal direction X being changed. In the simulation, when the change in shape of the solder stopped, the shape of the solder was determined as a bonding shape, and the lengths of projections of the solder that project from the end surfaces 11A and 12A were calculated. The volume of the melted solder on each of the lands 7 and 8 was set at a constant value of 1 million μm³, and the distance between the top surface of the land 7 and the bottom surface 17A of the electrode 3A, and between the top surface of the land 8 and the bottom surface 19A of the electrode 4A was set at a constant value of 20 μm.

Figure 6:
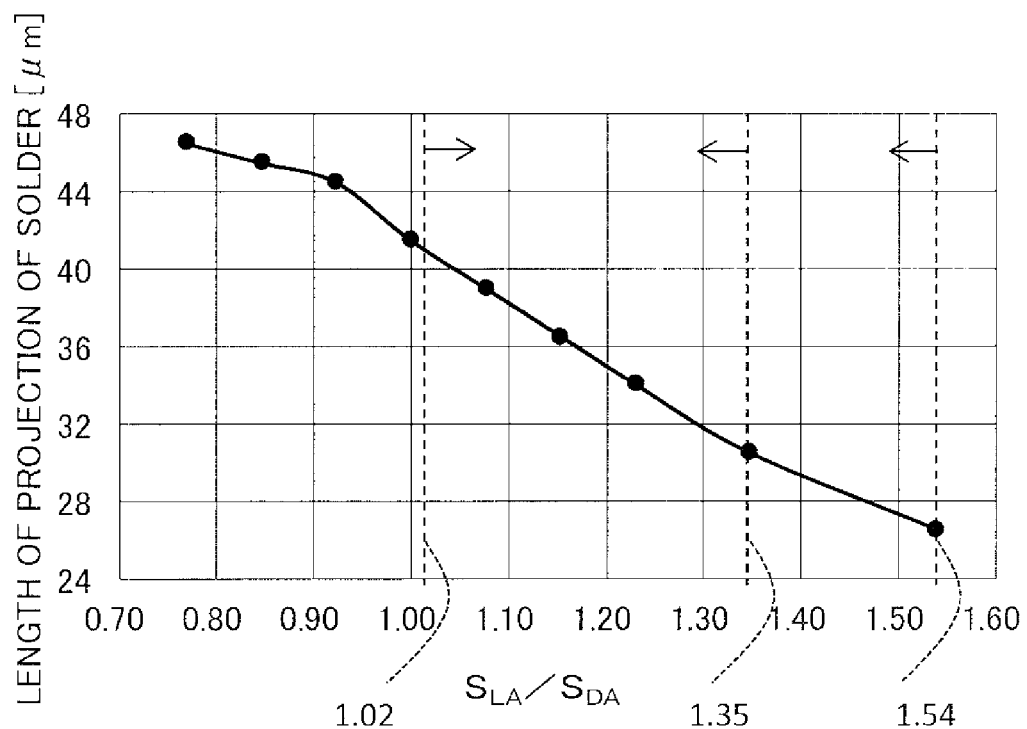
FIG. 6 is a graph illustrating a simulation result obtained in the second embodiment.

FIG. 6 is a graph illustrating a simulation result obtained in the second embodiment.

FIG. 6 illustrates a calculation result on the length of projection of the solder with respect to $S_{LA}/S_{DA}$. Note that since the length of projection of the solder that projects from the end surface 12A is the same as that of the solder that projects from the end surface 11A, the description will be made for the length of projection of the solder that projects from the end surface 11A.

It can be seen from FIG. 6 that when $S_{LA}/S_{DA} \le 0.92$, the length of projection of the solder that projects from the end surface 11A hardly changes. That is, the length of projection of the solder is not reduced. In contrast, it can be seen that when $S_{LA}/S_{DA}$ is equal to or larger than 1.02, the length of projection of the solder can be reduced by 10% or more, compared to the length obtained when $S_{LA}/S_{DA}=0.76$. Thus, it is preferable that $S_{LA}/S_{DA}$ is equal to or larger than 1.02. When $S_{LA}/S_{DA}$ is 1.02, the length $L_{iA}$ of the land 7 of the electronic component 1D is 132.5 μm. The thermal fluid simulation was performed with the length $L_{iA}$ of 132.5 μm, and the length of projection of the solder that projects outward in the longitudinal direction X from the end surface 11A was calculated. As a result, the length of projection of the solder is 41 μm. Thus, if the electronic component 1D is a resistor with the 0402 size, the upper limit of $L_{OA}/L_{iA}$ is 0.309 (=41/132.5).

The length of projection of the solder can be made smaller as the value of $S_{LA}/S_{DA}$ increases. However, if the width of the lands 7 and 8 in the lateral direction Y is 0.2 mm, and the lands 7 and 8 are extended in the longitudinal direction X, the lands 7 and 8 will contact each other when the length of each of the lands 7 and 8 in the longitudinal direction X is 0.2 mm. In this case, $S_{LA}/S_{DA}=1.54$, and $S_{LB}/S_{DB}=1.54$. Thus, the land 7 and the land 8 are separated from each other when $S_{LA}/S_{DA}<1.54$ and $S_{LB}/S_{DB}<1.54$.

In the subtractive process that is a common method of manufacturing printed boards, if a distance between lands is too small, the lands will contact each other and easily cause a short-circuit failure. The distance between the land 7 and the land 8 that hardly causes the short-circuit failure is 0.05 mm or more. Thus, if the width of the lands 7 and 8 in the lateral direction Y is set at a value of 0.2 mm, and the distance between the land 7 and the land 8 is set at a value of 0.05 mm, the length of each of the lands 7 and 8 in the longitudinal direction X is 0.175 mm. The thermal fluid simulation was performed with the length $L_{iA}$ of 175 and the length of projection of the solder that projects outward in the longitudinal direction X from the end surface 11A was calculated. As a result, the length of projection of the solder is 31 Thus, if the electronic component 1D is a resistor with the 0402 size, the lower limit of $L_{OA}/L_{iA}$ is 0.177 (=31/175). In this case, $S_{LA}/S_{DA}$ is 1.35.

As described above, in the second embodiment, it is preferable that $1.02 \le S_{LA}/S_{DA}$ and $1.02 \le S_{LB}/S_{DB}$ With these conditions, the length of projection of the solder that projects from the end surfaces 11A and 12A can be effectively reduced, and the short-circuit failure can be effectively prevented.

In addition, for preventing the short-circuit failure, the length of projection of the solder that projects from the end surfaces 11A and 12A is reduced. However, a certain amount of solder is necessary for the end surfaces 11A and 12A for keeping the bonding strength. Thus, it is preferable that $S_{LA}/S_{DA} \le 1.35$ and $S_{LB}/S_{DB} \le 1.35$.

Thus, if each of the electronic components 1D is a chip component that is a resistor with the 0402 size, and a distance Rx between two electronic components 1D adjacent to each other in the longitudinal direction X is 0.15 mm, the shortest distance D is calculated as 68 μm 150−41×2), from the above-described result.

As can be seen from the above-described simulation and the experimental result, the short-circuit failure and the failure in bonding can be prevented even when the distance Rx between two electronic components 1D in the longitudinal direction X is 0.15 mm. In addition, it was confirmed that the electronic components can be mounted at high density even when the distance Rx in the longitudinal direction X is 0.15 mm or less. Therefore, in the present embodiment, small electronic components 1D can be mounted at high density without disposing any additional members, such as spacers, between the electronic components 1D and the printed wiring board 5.

Note that although the description has been made for the electronic component 1D with the 0402 size, the present disclosure is not limited to this. For example, the electronic component 1D may have another size, such as the 0201 size, smaller than the 0402 size. That is, two electronic components 1D that face each other can be mounted at high density such that the distance Rx between the electronic components 1D in the longitudinal direction X of the main body 2 of each of the electronic components 1D is equal to or smaller than the width W of the main body 2 in the lateral direction Y.

Third Embodiment

Figure 7:
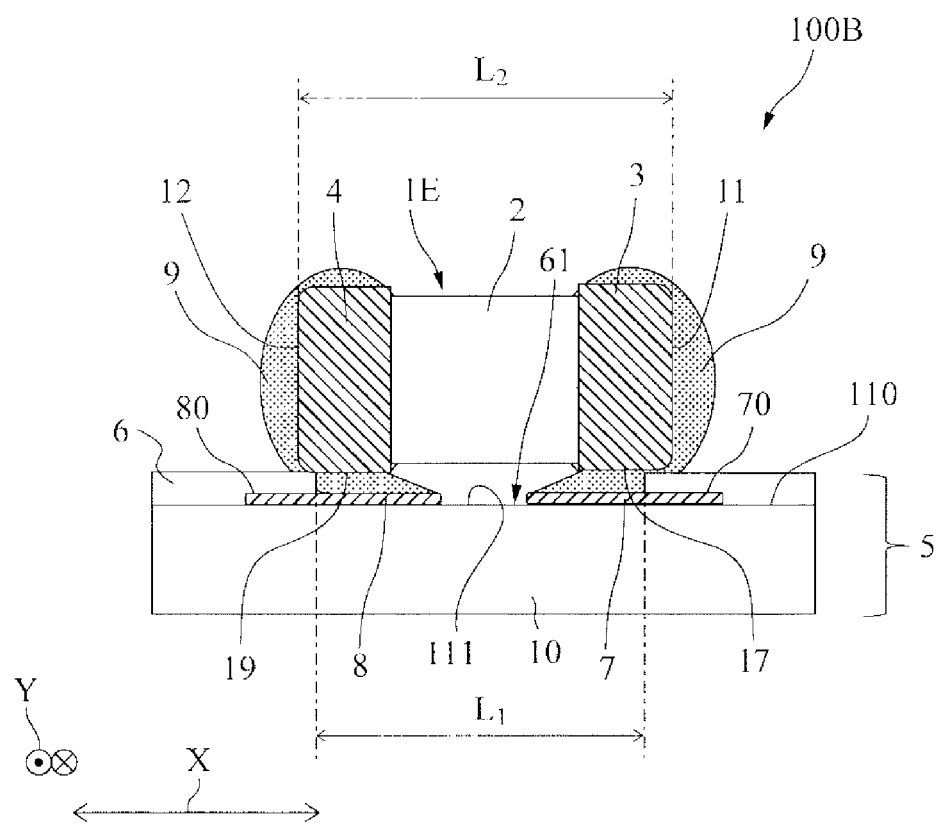
FIG. 7 is a schematic diagram of a bonding structure between an electronic component and a printed wiring board of a third embodiment.

Next, a printed circuit board of a third embodiment will be described. FIG. 7 is a schematic diagram of a bonding structure between an electronic component and a printed wiring board of a wireless communication module. The wireless communication module is one example of printed circuit boards of the third embodiment. In the third embodiment, a component identical to a component of the first and the second embodiments is given an identical symbol, and the detailed description thereof will be omitted.

In the first embodiment, the description has been made for the case where the length $L_2$ of the electronic components 1A, 1B, and 1C in the longitudinal direction X is equal to or smaller than the length $L_1$ of the opening 61 in the longitudinal direction X, that is, $0.894 \le L_2/L_1 \le 1$. However, the present disclosure is not limited to this, and is applicable as long as the relationship of $0.894 \le L_2/L_1 \le 1.120$ is satisfied. In the third embodiment, the length $L_2$ of an electronic component 1E in the longitudinal direction X is larger than the length $L_1$ of the opening 61 in the longitudinal direction X, that is, $1 < L_2/L_1 \le 1.120$.

The thickness of the solder resist film 6 is in a range from 10 to 35 μm, for example. The electrode 3 of the electronic component 1E is bonded to the land 7, exposed by the opening 61 of the solder resist film 6, via the solder bonding portion 9. The electrode 4 of the electronic component 1E is bonded to the land 8, exposed by the opening 61 of the solder resist film 6, via the solder bonding portion 9. The width of the opening 61 in the lateral direction Y is 0.2 mm, which is equal to the width of the electronic component 1E in the lateral direction Y. Thus, the opening 61 has a size that causes the electronic component 1E to hide the opening 61 in a plan view. That is, in a plan view of the printed wiring board 5, the whole of the opening 61 is covered by the electronic component 1E.

In the third embodiment, the size of the opening 61 of the solder resist film 6 of the printed wiring board 5 is 0.36×0.2 mm such that the opening 61 is hidden by the electronic component 1E.

Under the above-described conditions and other conditions equal to those of the first embodiment, the analysis was performed through the thermal fluid simulation.

Figure 8:
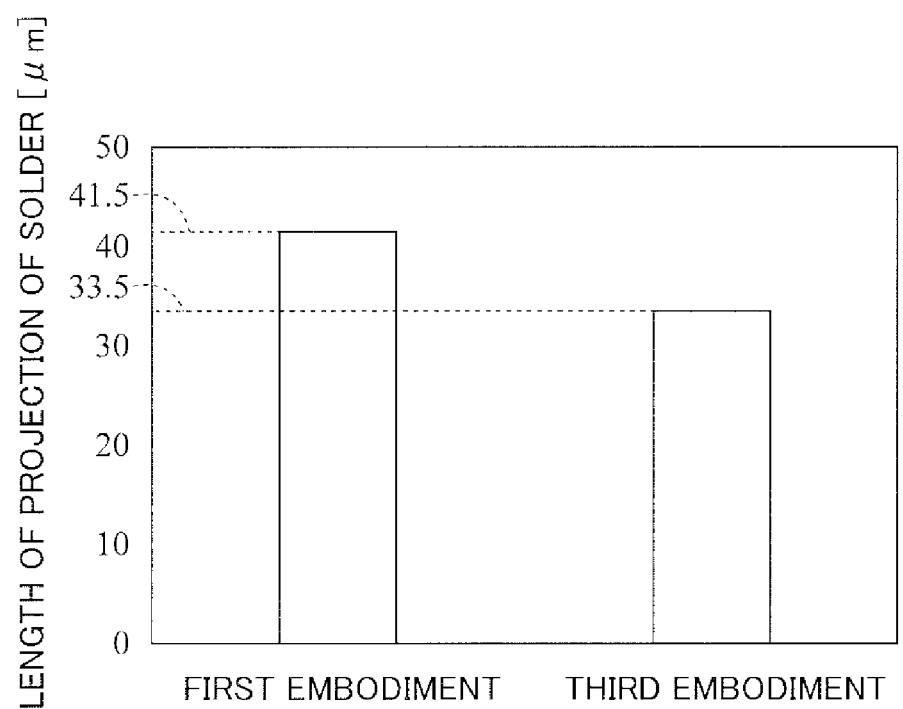
FIG. 8 is a graph illustrating a simulation result obtained in the third embodiment.

FIG. 8 is a graph illustrating a simulation result obtained in the third embodiment. FIG. 8 illustrates a simulation result on the length of projection of the solder that projects from the end surface 11 in the bonding structure of the first embodiment, and the simulation result on the length of projection of the solder that projects from the end surface 11 in the bonding structure of the third embodiment. Specifically, FIG. 8 illustrates the length of projection of the solder obtained when $S_{LA}/S_{DA}$=0.66 in both of the first and the third embodiments. As illustrated in FIG. 8, the length of projection of the solder in the first embodiment is 41.5 µm, and the length of projection of the solder in the third embodiment is 33.5 µm.

It was confirmed from this result that the length of projection of the solder is reduced more in the third embodiment than in the first embodiment. Thus, in the third embodiment, small electronic components 1E can be mounted at high density without disposing any additional members, such as spacers, between the electronic components 1E and the printed wiring board 5.

In the third embodiment, the end portions of the electronic component 1E in the longitudinal direction X are located above the solder resist film 6. Thus, during the reflow process, the melted solder is repelled by the solder resist film 6; and some of the melted solder moves to the lands 7 and 8, by a distance corresponding to the thickness of the solder resist film 6, in the thickness direction. As a result, the length of projection of the solder that adheres to the end surfaces 11 and 12 can be further reduced. Thus, two electronic components 1E adjacent to each other in the longitudinal direction X can be further closely disposed, spaced from each other by a distance equal to or smaller than the width of the main body 2 in the lateral direction Y. Although the description has been made for the electronic component 1E in the third embodiment, similar effects can be produced even when the third embodiment is applied to the electronic component 1A.

The present invention is not limited to the above-described embodiments, and can be modified within a technical spirit of the present invention.

In the above-described first to third embodiments, the description has been made for the case where the lands 7 and 8 are rectangular. The present disclosure, however, is not limited to this. For example, the lands 7 and 8 may have an elliptic shape or a convex shape. In addition, via-hole conductors may be disposed directly below the lands 7 and 8. With this structure, traces are easily drawn out when components are to be mounted at high density.

In the above-described first to third embodiments, the description has been made for the case where the width of the opening in the lateral direction is equal to the width of the electronic component in the lateral direction. The present disclosure, however, is not limited to this. For example, there may be a difference between the width of the opening in the lateral direction and the width of the electronic component in the lateral direction, and the difference may be in a range from −0.05 to +0.05 mm. That is, the present disclosure is applicable as long as the width of the opening in the lateral direction and the width of the electronic component in the lateral direction are substantially the same as each other within a predetermined tolerance range.

In the above-described first to third embodiments, the description has been made for the case where the edge portions 73, 74, 83, and 84 of the conductor patterns 70 and 80 in the lateral direction are covered with the solder resist film. The present disclosure, however, is not limited to this. The edge portions 73, 74, 83, and 84 of the conductor patterns 70 and 80 may not be covered with the solder resist film. In this case, the width of the lands 7 and 8 in the lateral direction may be equal to the width of the opening in the lateral direction, or may be smaller than the width of the opening in the lateral direction.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-059246, filed Mar. 26, 2019, and Japanese Patent Application No. 2020-032327, filed Feb. 27, 2020, which are hereby incorporated by reference herein in their entirety.

What is claimed is:

1. An electric module comprising:
   a printed wiring board having:
      an insulating substrate,
      a first land, a second land, a third land, a fourth land, a fifth land, and a sixth land disposed on the insulating substrate, and
      a solder resist film disposed on the insulating substrate and having a first opening, a second opening, and a third opening;
   a first chip component having a length in a longitudinal direction and a length in a lateral direction, the first chip component having a first electrode and a second electrode disposed at end portions in the longitudinal direction;
   a second chip component having a length in the longitudinal direction and a length in the lateral direction, the second chip component having a third electrode and a fourth electrode disposed at end portions in the longitudinal direction; and
   a third chip component having a length in the longitudinal direction and a length in the lateral direction, the third chip component having a fifth electrode and a sixth electrode disposed at end portions in the longitudinal direction,
   wherein a portion of the first land and a portion of the second land are exposed in the first opening,
   wherein the first electrode connects the first land by solder,
   wherein the second electrode connects the second land by solder,
   wherein a portion of the third land and a portion of the fourth land are exposed in the second opening,
   wherein the third electrode connects the third land by solder,
   wherein the fourth electrode connects the fourth land by solder,
   wherein a portion of the fifth land and a portion of the sixth land are exposed in the third opening, wherein the fifth electrode connects the fifth land by solder, wherein the sixth electrode connects the sixth land by solder, wherein the longitudinal direction of the first chip component and the longitudinal direction of the second chip component are along a first direction, wherein the lateral direction of the first chip component and the lateral direction of the third chip component are along a second direction intersecting the first direction, wherein the solder is disposed on a side end surface of the first electrode, on a side end surface of the second electrode, on a side end surface of the third electrode, on a side end surface of the fourth electrode, on a side end surface of the fifth electrode, and on a side end surface of the sixth electrode, and wherein a relationship of $0.894 \le L1/L2$ is satisfied, where L1 represents a length of the first opening in the longitudinal direction of the first chip component, a length of the second opening in the longitudinal direction of the second chip component, and a length of the third opening in the longitudinal direction of the third chip component, L2 represents a length of the first chip component in the longitudinal direction, a length of the second chip component in the longitudinal direction, and a length of the third chip component in the longitudinal direction.

2. The electric module according to claim 1, wherein a relationship of $Rx \le Ry$ is satisfied, where Rx represents a distance between the first chip component and the second chip component, and Ry represents a distance between the first chip component and the third chip component.

3. The electric module according to claim 2, wherein the distance Rx between the first chip component and the second chip component is 0.15 mm or less.

4. The electric module according to claim 1, wherein a relationship of $L1/L2 \le 1.120$ is satisfied.

5. An electronic device comprising:
a housing; and
the electric module according to claim 1 disposed in the housing.

6. The electronic device according to claim 5, wherein a surface of the electronic module on which the solder resist film is provided is disposed closer to the housing than to a surface on which the solder resist film is not provided.

7. The electronic device according to claim 5, wherein the electronic device is a camera.

8. The electric module according to claim 1, wherein a relationship of $Rx \le W$ is satisfied, where Rx represents a distance between the first chip component and the second chip component, and W represents a length of the first chip component in the lateral direction, a length of the second chip component in the lateral direction, and a length of the third chip component in the lateral direction.

9. The electric module according to claim 1, wherein the first chip component is an inductor or a capacitor, the second chip component is an inductor or a capacitor and the third chip component is an inductor or a capacitor, wherein a relationship of $0.183 \le L_{OA}/L_{iA} \le 0.309$ is satisfied, where $L_{iA}$ represents a length of the first land in the longitudinal direction, and $L_{OA}$ represents a thickness of solder on an end surface of the first electrode, wherein a relationship of $0.183 \le L_{OB}/L_{iA} \le 0.309$ is satisfied, where $L_{iB}$ represents a length of the second land in the longitudinal direction, and $L_{OB}$ represents a thickness of solder on an end surface of the second electrode, wherein a relationship of $0.183 < L_{OC}/L_{iA} \le 0.309$ is satisfied, where $L_{iC}$ represents a length of the third land in the longitudinal direction, and $L_{OC}$ represents a thickness of solder on an end surface of the third electrode, and wherein a relationship of $0.183 \le L_{OD}/L_{iD} \le 0.309$ is satisfied, where $L_{iD}$ represents a length of the fourth land in the longitudinal direction, and $L_{OD}$ represents a thickness of solder on an end surface of the fourth electrode.

10. The electric module according to claim 1, wherein the first chip component is an inductor or a capacitor, the second chip component is an inductor or a capacitor and the third chip component is an inductor or a capacitor, wherein a relationship of $0.66 \le S_{LA}/S_{DA} \delta 0.88$ is satisfied, where SDA represents an area of the end surface of the first electrode, and $S_{LA}$ represents an area of the first land, wherein a relationship of $0.66 \le S_{LB}/S_{DB} 30.88$ is satisfied, where $S_{DB}$ represents an area of the end surface of the second electrode, and $S_{LB}$ represents an area of the second land, wherein a relationship of $0.66 \le S_{LC}/S_{DC} \le 0.88$ is satisfied, where $S_{DC}$ represents an area of the end surface of the third electrode, and $S_{LC}$ represents an area of the third land, and wherein a relationship of $0.66 \le S_{LD}/S_{DD} \delta 0.88$ is satisfied, where $S_{DD}$ represents an area of the end surface of the fourth electrode, and $S_{LD}$ represents an area of the fourth land.

11. The electric module according to claim 1, wherein the first chip component is a resistor, the second chip component is a resistor and the third chip component is a resistor, wherein a relationship of $0.177 \le L_{OA}/L_{iA} \le 0.309$ is satisfied, where $L_{iA}$ represents a length of the first land in the longitudinal direction, and $L_{OA}$ represents a thickness of solder on an end surface of the first electrode, wherein a relationship of $0.177 \le L_{OB}/L_{iB} \le 0.309$ is satisfied, where $L_{iB}$ represents a length of the second land in the longitudinal direction, and $L_{OB}$ represents a thickness of solder on an end surface of the second electrode, wherein a relationship of $0.177 \le L_{OC}/L_{iC} \le 0.309$ is satisfied, where $L_{iC}$ represents a length of the third land in the longitudinal direction, and $L_{OC}$ represents a thickness of solder on an end surface of the third electrode, and wherein a relationship of $0.177 \le L_{OD}/L_{iD} \le 0.309$ is satisfied, where $L_{iD}$ represents a length of the fourth land in the longitudinal direction, and $L_{OD}$ represents a thickness of solder on an end surface of the fourth electrode.

12. The electric module according to claim 1, wherein the first chip component is a resistor, the second chip component is a resistor and the third chip component is a resistor, wherein a relationship of $1.02 \le S_{LC}/S_{DC} \le 1.35$ is satisfied, where $S_{DC}$ represents an area of the end surface of the third electrode, and $S_{LC}$ represents an area of the third land, and wherein a relationship of $1.02 \le S_{LD}/S_{DD} \le 1.35$ is satisfied, where $S_{DD}$ represents an area of the end surface of the fourth electrode, and $S_{LD}$ represents an area of the fourth land.

13. The electric module according to claim 1, wherein each of the first chip component, the second chip component and the third chip component is a chip component with a size equal to or smaller than 0603 size.

14. An electric module comprising:
a printed wiring board having:
an insulating substrate, a first land, a second land, a third land, a fourth land, a fifth land, and a sixth land disposed on the insulating substrate, and
a solder resist film disposed on the insulating substrate and having a first opening, a second opening, and a third opening;
a first chip component having a length in a longitudinal direction and a length in a lateral direction, the first chip component having a first electrode and a second electrode disposed at end portions in the longitudinal direction;
a second chip component having a length in the longitudinal direction and a length in the lateral direction, the second chip component having a third electrode and a fourth electrode disposed at end portions in the longitudinal direction; and
a third chip component having a length in the longitudinal direction and a length in the lateral direction, the third chip component having a fifth electrode and a sixth electrode disposed at end portions in the longitudinal direction,
wherein a portion of the first land and a portion of the second land are exposed in the first opening,
wherein the first electrode connects the first land by solder,
wherein the second electrode connects the second land by solder,
wherein a portion of the third land and a portion of the fourth land are exposed in the second opening,
wherein the third electrode connects the third land by solder,
wherein the fourth electrode connects the fourth land by solder,
wherein a portion of the fifth land and a portion of the sixth land are exposed in the third opening,
wherein the fifth electrode connects the fifth land by solder,
wherein the sixth electrode connects the sixth land by solder,
wherein the longitudinal direction of the first chip component and the longitudinal direction of the second chip component are along a first direction,
wherein the lateral direction of the first chip component and the lateral direction of the third chip component are along a second direction intersecting the first direction,
wherein the solder is disposed on a side end surface of the first electrode, on a side end surface of the second electrode, on a side end surface of the third electrode, on a side end surface of the fourth electrode, on a side end surface of the fifth electrode, and on a side end surface of the sixth electrode, and
wherein a relationship of L2<L1 is satisfied, where L1 represents a length of the first opening in the longitudinal direction of the first chip component, a length of the second opening in the longitudinal direction of the second chip component, and a length of the third opening in the longitudinal direction of the third chip component, L2 represents a length of the first chip component in the longitudinal direction, a length of the second chip component in the longitudinal direction, and a length of the third chip component in the longitudinal direction,
wherein the solder disposed on the side end surface of the first electrode and the solder connecting the first land and the first electrode are not connected,
wherein the solder disposed on the side end surface of the second electrode and the solder connecting the second land and the second electrode are not connected,
wherein the solder disposed on the side end surface of the third electrode and the solder connecting the third land and the third electrode are not connected,
wherein the solder disposed on the side end surface of the fourth electrode and the solder connecting the fourth land and the fourth electrode are not connected,
wherein the solder disposed on the side end surface of the fifth electrode and the solder connecting the fifth land and the fifth electrode are not connected, and
wherein the solder disposed on the side end surface of the sixth electrode and the solder connecting the sixth land and the sixth electrode are not connected.

15. The electric module according to claim 14, wherein a relationship of Rx≤Ry is satisfied, where Rx represents a distance between the first chip component and the second chip component, and Ry represents a distance between the first chip component and the third chip component.

16. The electric module according to claim 15, wherein the distance Rx between the first chip component and the second chip component is 0.15 mm or less.

17. An electronic device comprising:
a housing; and the electric module according to claim 14 disposed in the housing.

18. The electronic device according to claim 17, wherein a surface of the electronic module on which the solder resist film is provided is disposed closer to the housing than to a surface on which the solder resist film is not provided.

19. The electronic device according to claim 17, wherein the electronic device is a camera.

20. The electric module according to claim 14, wherein a relationship of Rx≤W is satisfied, where Rx represents a distance between the first chip component and the second chip component, and W represents a length of the first chip component in the lateral direction, a length of the second chip component in the lateral direction, and a length of the third chip component in the lateral direction.

21. The electric module according to claim 14, wherein the first chip component is an inductor or a capacitor, the second chip component is an inductor or a capacitor and the third chip component is an inductor or a capacitor,
wherein a relationship of $0.183 \leq L_{OA}/L_{iA} \leq 0.309$ is satisfied, where $L_{iA}$ represents a length of the first land in the longitudinal direction, and $L_{OA}$ represents a thickness of solder on an end surface of the first electrode,
wherein a relationship of $0.183 \leq L_{OB}/L_{iA} \leq 0.309$ is satisfied, where $L_{iB}$ represents a length of the second land in the longitudinal direction, and $L_{OB}$ represents a thickness of solder on an end surface of the second electrode,
wherein a relationship of $0.183 \leq L_{OC}/L_{iA} \leq 0.309$ is satisfied, where $L_{iC}$ represents a length of the third land in the longitudinal direction, and $L_{OC}$ represents a thickness of solder on an end surface of the third electrode, and
wherein a relationship of $0.183 \leq L_{OD}/L_{iD} \leq 0.309$ is satisfied, where $L_{iD}$ represents a length of the fourth land in the longitudinal direction, and $L_{OD}$ represents a thickness of solder on an end surface of the fourth electrode.

22. The electric module according to claim 14, wherein the first chip component is an inductor or a capacitor, the second chip component is an inductor or a capacitor and the third chip component is an inductor or a capacitor,
wherein a relationship of $0.66 \leq S_{LA}/S_{DA} \leq 0.88$ is satisfied, where SDA represents an area of the end surface of the first electrode, and $S_{LA}$ represents an area of the first land, wherein a relationship of $0.66 \leq S_{LB}/S_{DB} \leq 0.88$ is satisfied, where $S_{DB}$ represents an area of the end surface of the second electrode, and $S_{LB}$ represents an area of the second land, wherein a relationship of $0.66 \leq S_{LC}/S_{DC} \leq 0.88$ is satisfied, where $S_{DC}$ represents an area of the end surface of the third electrode, and $S_{LC}$ represents an area of the third land, and wherein a relationship of $0.66 \leq S_{LD}/S_{DD} \leq 0.88$ is satisfied, where $S_{DD}$ represents an area of the end surface of the fourth electrode, and $S_{LD}$ represents an area of the fourth land.

23. The electric module according to claim 14, wherein the first chip component is a resistor, the second chip component is a resistor and the third chip component is a resistor, wherein a relationship of $0.177 < L_{OA}/L_{iA} \leq 0.309$ is satisfied, where $L_{iA}$ represents a length of the first land in the longitudinal direction, and $L_{OA}$ represents a thickness of solder on an end surface of the first electrode, wherein a relationship of $0.177 < L_{OB}/L_{iB} \leq 0.309$ is satisfied, where $L_{iB}$ represents a length of the second land in the longitudinal direction, and $L_{OB}$ represents a thickness of solder on an end surface of the second electrode, wherein a relationship of $0.177 < L_{OC}/L_{iC} \leq 0.309$ is satisfied, where $L_{iC}$ represents a length of the third land in the longitudinal direction, and $L_{OC}$ represents a thickness of solder on an end surface of the third electrode, and wherein a relationship of $0.177 \leq L_{OD}/L_{iD} \leq 0.309$ is satisfied, where $L_{iD}$ represents a length of the fourth land in the longitudinal direction, and $L_{OD}$ represents a thickness of solder on an end surface of the fourth electrode.

24. The electric module according to claim 14, wherein the first chip component is a resistor, the second chip component is a resistor and the third chip component is a resistor, wherein a relationship of $1.02 \leq S_{LC}/S_{DC} \leq 1.35$ is satisfied, where $S_{DC}$ represents an area of the end surface of the third electrode, and $S_{LC}$ represents an area of the third land, and wherein a relationship of $1.02 \leq S_{LD}/S_{DD} \leq 1.35$ is satisfied, where $S_{DD}$ represents an area of the end surface of the fourth electrode, and $S_{LD}$ represents an area of the fourth land.

25. The electric module according to claim 14, wherein each of the first chip component, the second chip component and the third chip component is a chip component with a size equal to or smaller than 0.603 size.

* * * * *